US012658401B2

(12) United States Patent
Heinrich

(10) Patent No.: US 12,658,401 B2
(45) Date of Patent: Jun. 16, 2026

(54) PROXIMITY-ELECTRODE, CHARGED PARTICLE BEAM DEVICE AND METHOD FOR INSPECTING AND/OR IMAGING A SAMPLE

(71) Applicant: ICT Integrated Circuit Testing Gesellschaft für Halbleiterprüftechnik mbH, Heimstetten (DE)

(72) Inventor: Stephan Heinrich, Munich (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 244 days.

(21) Appl. No.: 18/372,361

(22) Filed: Sep. 25, 2023

(65) Prior Publication Data

US 2025/0104959 A1 Mar. 27, 2025

(51) Int. Cl.
*H01J 37/147* (2006.01)

(52) U.S. Cl.
CPC ....... *H01J 37/147* (2013.01); *H01J 2237/036* (2013.01)

(58) Field of Classification Search
CPC ............... H01J 37/147; H01J 2237/036; H01J 2237/004; H01J 2237/047; H01J 2237/24475; H01J 37/244; H01J 37/28; H01J 2237/2449; H01J 2237/281; H01J 37/045; H01J 37/09; H01J 37/222
See application file for complete search history.

(56) References Cited

U.S. PATENT DOCUMENTS

| | | | | |
|---|---|---|---|---|
| 5,401,974 A * | 3/1995 | Oae | | H01J 37/3002 |
| | | | | 250/492.1 |
| 7,875,858 B2 * | 1/2011 | Ito | | H01J 37/28 |
| | | | | 250/492.1 |
| 8,349,125 B2 * | 1/2013 | Vane | | H01J 37/26 |
| | | | | 156/345.43 |
| 9,754,759 B2 * | 9/2017 | Cook | | H01J 37/147 |
| 2007/0040113 A1 * | 2/2007 | Monroe | | G04F 5/14 |
| | | | | 250/288 |
| 2009/0309022 A1 * | 12/2009 | Gunji | | H01J 37/28 |
| | | | | 250/311 |
| 2010/0038537 A1 * | 2/2010 | Benner | | H01J 37/26 |
| | | | | 250/311 |
| 2015/0021474 A1 * | 1/2015 | Firnkes | | H01J 37/244 |
| | | | | 250/306 |
| 2017/0047192 A1 * | 2/2017 | Frosien | | H01J 37/28 |
| 2025/0104959 A1 * | 3/2025 | Heinrich | | H01J 37/28 |

* cited by examiner

*Primary Examiner* — David A Vanore
(74) *Attorney, Agent, or Firm* — Kilpatrick Townsend & Stockton LLP

(57) ABSTRACT

A proximity-electrode for a charged particle beam device is provided, the proximity-electrode including a body having an aperture within the body, and the body having a plurality of protrusions cantilevering radially into the aperture, and the aperture and the protrusions having an n-fold rotational symmetry, where n is an integer.

19 Claims, 5 Drawing Sheets

PROXIMITY-ELECTRODE, CHARGED PARTICLE BEAM DEVICE AND METHOD FOR INSPECTING AND/OR IMAGING A SAMPLE

TECHNICAL FIELD

The present disclosure relates to a proximity-electrode for a charged particle beam device, a charged particle beam device for at least one of imaging and inspecting a sample, and a method for at least one of inspecting and imaging a sample with a charged particle beam device, in particular a charged particle beam device for at least one of imaging and inspecting a sample, the charged particle beam device having a proximity-electrode and a method for at least one of inspecting and imaging a sample with a charged particle beam device having a proximity-electrode.

BACKGROUND

Charged particle beam devices have many applications in a plurality of industrial fields including, but not limited to, critical dimensioning of semiconductor devices during manufacturing, defect review of semiconductor devices, inspection of semiconductor devices, exposure systems for lithography, detecting devices and testing systems. There is a particularly high demand for high-performance charged particle beam devices for structuring, testing and inspecting specimens or samples on the micrometer and nanometer scale.

Micrometer and nanometer scale process control, inspection and structuring are often done with charged particle beams, in particular electron beams, that are generated and focused in charged particle beam devices such as scanning electron microscopes. Charged particle beams offer superior spatial resolution, for example compared to photon beams, due to their short wavelengths.

Sample inspection and imaging generally involves the detection of interaction particles and interaction radiation which are generated when a primary charged particle beam impinges on a sample. Interaction particles are for example secondary charged particles and backscattered charged particles, in particular secondary electrons and backscattered electrons. Interaction radiation include X-rays and cathodoluminescence light.

Document US2017/047192A1 describes a system with an electrode including a first opening for the passage of the primary charged particle beam and second opening(s) for the passage of off-axial backscattered particles. The electrode is the closest electrode of the charged particle beam device to the sample.

In view of the electrode having effect on the passage of the primary charged particle and signal particles, it may be considered that improvements to the electrode, as well as corresponding charged particle beam devices and methods for operating thereof, are desirable for meeting current demands for high-performance charged particle beam devices for structuring, testing and inspecting specimens or samples on the micrometer and nanometer scale.

SUMMARY

The present disclosure has the object to meet the current demands for improvements to the state of the art. In view thereof, a proximity-electrode for a charged particle beam device, a charged particle beam device for at least one of imaging and inspecting a sample having a proximity-electrode, and a method for at least one of inspecting and imaging a sample with a charged particle beam device, in particular a method for at least one of inspecting and imaging a sample with a charged particle beam device having a proximity-electrode are described as follows.

According to an aspect, a proximity-electrode for a charged particle beam device includes a body having an aperture within the body, and the body having a plurality of protrusions cantilevering radially into the aperture, the aperture and the protrusions having an n-fold rotational symmetry, n being an integer.

According to an aspect, a charged particle beam device for at least one of imaging and inspecting a sample is provided. According to the aspect, the charged particle beam device includes a beam emitter for emitting a primary charged particle beam; and a retarding field device for retarding the primary charged particle beam before the primary charged particle beam impinges on the sample, the retarding field device comprising an objective lens and a proximity-electrode arranged downstream of a principal plane of the objective lens; wherein the charged particle beam device is adapted for guiding the primary charged particle beam along an optical axis to the sample for generating signal charged particles from the sample.

According to an aspect, a method for at least one of imaging and inspection of a sample using a charged particle beam device having a proximity-electrode is provided.

Further aspects, embodiments, examples, features, and advantages thereof may be understood from the following detailed description, in reference to the accompanying drawings.

BRIEF DESCRIPTION OF THE DRAWINGS

So that the manner in which the above recited aspects of the present disclosure may be further understood, a more detailed description is provided in the following, with reference to the accompanying drawings including.

DETAILED DESCRIPTION

Figure 1:
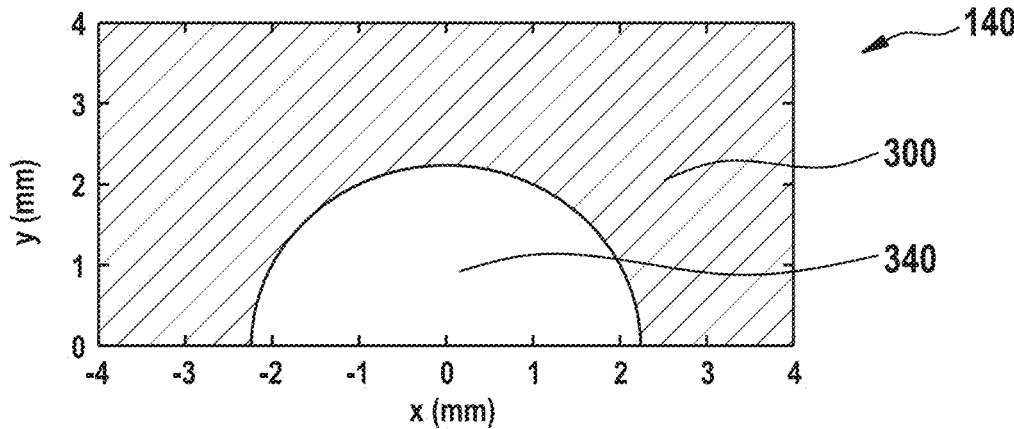
FIG. 1 showing a proximity-electrode, which is not encompassed by the claims, having neither protrusions nor bulbous ends, and which is useful for understanding the invention.

Reference will now be made in detail to the various aspects, embodiments, examples, one or more of which are shown or illustrated further in the figures. Within the following description, the same reference numbers refer to the same components. Generally, only the differences with respect to individual embodiments are described. Each aspect, embodiment, and example is provided by way of explanation and is not meant as a limitation. Furthermore, features illustrated or described as part of one embodiment can be used on or in conjunction with other embodiments to yield yet a further embodiment. It is intended that the present disclosure includes such modifications and variations.

A "proximity-electrode" as used herein may be understood as an electrode arranged in proximity to a sample, in particular between the objective lens and the sample (or the sample stage). In particular, the proximity-electrode may be understood to be arranged downstream of the objective lens in the propagation direction of the primary charged particle beam. It may be understood that the proximity-electrode is the last electrode or last element influencing the primary charged particle beam, and/or the proximity-electrode is the last electrode or last element traversed by the primary charged particle beam before impinging on the sample.

Embodiments of the present disclosure relate to a proximity-electrode having a large aperture. This enables more signal charged particles to traverse the proximity-electrode. In example applications such as imaging of high-aspect ratio features and/or collection of large angle fast backscattered charged particles, a proximity-electrode with a large aperture increases the signal charged particle collection angle. By increasing the number and/or angle of signal charged particle collection, imaging and inspection can be improved. In particular, signal-to-noise ratio, acquisition time and/or contrast can be improved.

Embodiments of the present disclosure provide a proximity-electrode with one or more of the following benefits: a large aperture, low field penetration through the proximity-electrode, minimum shadowing effect, and minimal surface electric field.

According to an aspect, a proximity-electrode includes a body having an aperture within the body, wherein the body includes a plurality of protrusions cantilevering radially into the aperture, wherein the aperture and/or the protrusions have an n-fold rotational symmetry, n being an integer. The proximity-electrode may be understood to be adapted for a charged particle beam device, according to embodiments and examples described herein.

The present disclosure relates to an improved proximity-electrode, in particular, an improved aperture design. The improved proximity-electrode is particularly beneficial in a charged particle beam device such as a scanning electron microscope. The present disclosure further relates to an improved charged particle beam device including a proximity-electrode as described herein.

A proximity-electrode according to embodiments of the present disclosure allows enlargement of the area for trespassing of signal electrons, i.e. reducing shadowing, which can be beneficial for the imaging and inspecting of samples. Furthermore, the extraction field strength can be controlled without overly increasing the magnitude of the voltage applied to the proximity-electrode.

In general, round apertures are often used in proximity-electrodes. By adapting the geometry of the aperture, e.g. adding protrusions, the aperture can be beneficially enlarged, thus allowing more signal charged particles and/or wider angle signal charged particles to traverse the proximity-electrode and be collected/detected, without undesirably increasing field penetration from the column above. As described in further detail herein, the geometry and/or number of protrusions can provide different degrees of reduction of the field penetration.

The protrusions can be understood to protrude from a side of the proximity-electrode body facing inward, towards a center of the aperture, without covering or overlapping a center or central area of the aperture. Accordingly, having a central portion, where the primary charged particle beam traverses, clear of protrusions effectively provides for a high-performance primary charged particle beam, specifically a primary beam spot size that is comparable to a primary beam spot size when using a proximity-electrode without an enlarged aperture and without protrusions. In other words, the benefits of the improved proximity-electrode as described herein can be achieved without deterioration of the primary charged particle beam, in particular of the primary beam spot size.

A central circle may be understood as a central portion or part of the aperture, or a central opening, arranged or configured to allow the unimpeded traversal of the primary charged particle beam.

According to an embodiment, which can be combined with other aspects and embodiments, a central circle within a plane of the aperture of the proximity-electrode is clear of protrusions, preferably the radius of the circle extending up to an end of one or more protrusions. Beneficially, the primary charged particle beam can traverse the proximity-electrode without undue distortion and primary beam spot size is good.

According to an embodiment, which can be combined with other aspects and embodiments, a diameter of the central circle (of the aperture of the proximity-electrode) is at least twice a height of a space separating the proximity-electrode 140 and a sample 150 or a sample stage. Beneficially, a large number of signal charged particles can traverse the proximity-electrode.

According to an embodiment, which can be combined with other aspects and embodiments, a diameter of the central circle of the proximity-electrode 140 is at least twice of a distance between the proximity-electrode 140 and the sample 150 or sample stage, or twice of a height of a space between the proximity-electrode 140 and the sample 150 or sample stage. In an example, a width or diameter or a central circle, a central portion, or a central opening (of the aperture of the proximity-electrode) is (approximately) at least twice the distance between the proximity-electrode 140 and the sample 150 or sample stage, or the working distance of the charged particle beam device.

According to an embodiment, all areas of the aperture, in particular areas inside the central circle and outside the central circle, are contiguous with each other, particularly in a plane of the aperture.

It is beneficial that the protrusions extend in a radial orientation, in particular for the operation of the proximity-electrode. A proximity-electrode having protrusions which cantilever radially minimizes structure and material obstructing the passage of signal charged particles emanating from the sample travelling towards a detector.

In particular, by avoiding structure and material having circumferential extension without radial extension, such as an inner ring element within the aperture, and by providing the protrusions which cantilever substantially or wholly in the radial direction, shadow effects, in particular shadowing in the radial direction, can be minimized.

According to an embodiment, one or more of the protrusions, in particular, all of the protrusions, cantilever perpendicular to the optical axis in particular of the charged particle beam device, to an axis of the proximity-electrode, and/or to the primary charged particle beam. Beneficially, protrusions which cantilever perpendicular to the optical axis, to the axis of the proximity-electrode, and/or to the primary charged particle beam, enable both a shorter working distance and minimal shadowing.

It is beneficial to avoid very high voltages and/or surface electric fields, at least for reducing demand on controls, power supplies and/or reducing electric arc risk. Adding protrusions allows for a lower voltage and less intense surface electric field for the same extraction field strength.

It is particularly beneficial when the end(s) or tip(s) of the protrusions extend radially sufficiently, e.g. length of each protrusion is at least 5% of a radius of the aperture) and/or culminate nearer to the center of the aperture or to each other (e.g. length of each protrusion is up to 80% of a radius of the aperture).

Embodiments of the present disclosure provide rounded edges, e.g. chamfered edges, with large convex radii, minimum convex radius, minimum radius of curvature and/or minimum radius of the protrusions, particularly at the end(s) or tip(s) of the protrusions, specifically at the end(s) or tip(s) nearest to the center or central area of the aperture.

For example, the end(s) or tip(s) of the protrusions have a bulbous, distended, globular or rounded shape, and/or have a larger width, radius or radius of curvature than a middle or non-end/tip part of the protrusion.

According to an embodiment, which may be combined with other embodiments described herein, each protrusion has a minimum radius of curvature at a tip portion or an end portion of the protrusion which is larger than at a middle portion of the protrusion.

According to an embodiment, which may be combined with other embodiments described herein, a minimum radius of curvature of each of the protrusions is more than 5% of a width or a diameter of the respective protrusion, preferably more than 10% of a width or diameter of the respective protrusion, and most preferably more than 20% of a width or diameter of the respective protrusion. Beneficially, minimal peak surface electric field is achieved.

According to an embodiment, which may be combined with other embodiments described herein, a minimum radius of curvature of each of the protrusions in a plane perpendicular to a plane of the proximity-electrode and/or to a plane of the aperture of the proximity-electrode is more than or larger than a minimum radius of curvature of the respective protrusion in a plane of the proximity-electrode and/or in a plane of the aperture of the proximity-electrode.

A plane of the proximity-electrode may be understood to be a plane of symmetry of the proximity-electrode or a plane bisecting (all of the protrusions of) the proximity-electrode or a plane perpendicular to an axis of symmetry of the proximity-electrode or a plane perpendicular to a central axis of the proximity-electrode or a plane perpendicular to an axis of symmetry of the aperture of the proximity-electrode or a plane perpendicular to an optical axis.

A plane of the aperture of the proximity-electrode may be understood to be a plane of symmetry of the aperture of the proximity-electrode or a plane bisecting the aperture of the proximity-electrode or a plane perpendicular to an axis of symmetry of the aperture of the proximity-electrode or a plane perpendicular to a central axis of the aperture of the proximity-electrode or a plane perpendicular to an axis of symmetry of the aperture of the proximity-electrode or a plane perpendicular to an optical axis.

According to an embodiment, which may be combined with other embodiments described herein, a minimum radius of curvature of each of the protrusions in an upward direction and/or in a direction away from a sample and/or sample stage and/or in a direction towards a source of the primary charged particle beam and/or on an upstream side of the proximity-electrode (according to the propagation direction of a primary charged particle beam) is more than or larger than a minimum radius of curvature of the respective protrusion in a plane of the proximity-electrode and/or in a plane of the aperture of the proximity-electrode.

According to an embodiment, which may be combined with other embodiments described herein, a minimum radius of curvature of each of the protrusions in an upward direction and/or in a direction away from a sample and/or sample stage and/or in a direction towards a source of the primary charged particle beam and/or on an upstream side of the proximity-electrode (according to the propagation direction of a primary charged particle beam) is more than or larger than a minimum radius of curvature of the respective protrusion in a downward direction and/or in a direction towards a sample and/or sample stage and/or in a direction away from a source of the primary charged particle beam and/or on a downstream side of the proximity-electrode (according to the propagation direction of a primary charged particle beam).

Beneficially, peak surface electric field in a plane perpendicular to the plane proximity-electrode, in particular in the upward direction or in a direction towards the source of the charged particle beam, where field strength is critical, is minimized. Beneficially, an even more rounded edge can be provided where field strength is most critical.

According to an embodiment, the protrusions have a minimum radius of curvature such that a peak surface electric field or a maximum magnitude of a surface electric field on the protrusions is at most 3 times or less than 3 times a peak surface electric field or a maximum magnitude of a surface electric field on the body of the proximity-electrode or on a non-protrusion part or a non-protruding part of the proximity-electrode.

According to an embodiment, each protrusion has a minimum radius of curvature that is at least half of a width of the protrusion.

In a particular embodiment, a minimum radius of curvature at a free end or at a tip of each protrusion is equal to or larger than a half of a width at a middle or at a stem of the respective protrusion.

In a particular embodiment, a minimum radius of curvature of each protrusion at a free end or at a tip of the respective protrusion is equal to or larger than a half of a width of the respective protrusion at a middle or at a stem of the respective protrusion.

Beneficially, peak surface electric field is sufficiently minimized and risk of electric arcing is sufficiently low.

The following table shows some parameters for different proximity-electrode designs. For a specific extraction field, values of peak surface electric field strength, clear aperture size and proximity-electrode operating voltage (which is related to field penetration; where the design allows a higher degree of field penetration, a higher voltage is needed to achieve the same extraction field) are compared for different proximity-electrode designs.

TABLE 1

Figure 2:
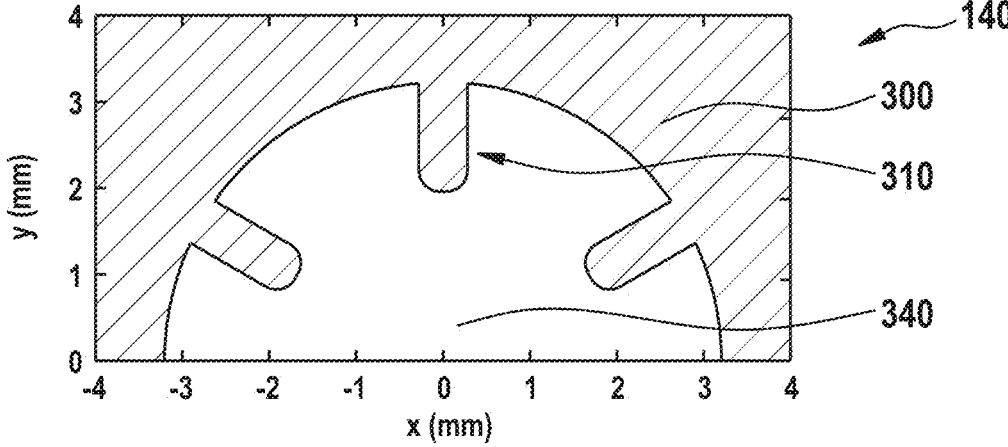
FIG. 2 showing a proximity-electrode including protrusions without bulbous ends, the protrusions cantilevering into the aperture, according to embodiments and examples described herein.
Figure 3:
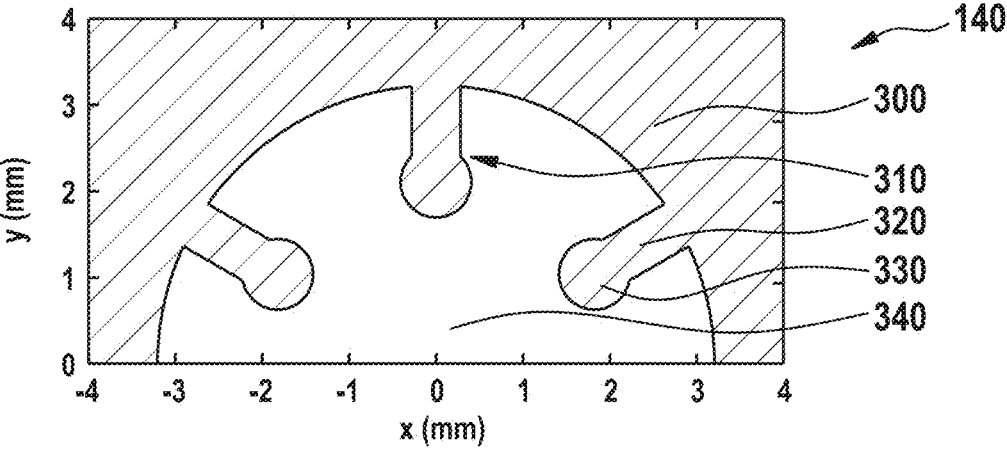
FIG. 3 showing a proximity-electrode including protrusions with bulbous ends and cantilevering into the aperture, according to embodiments and examples described herein.
Figure 4:
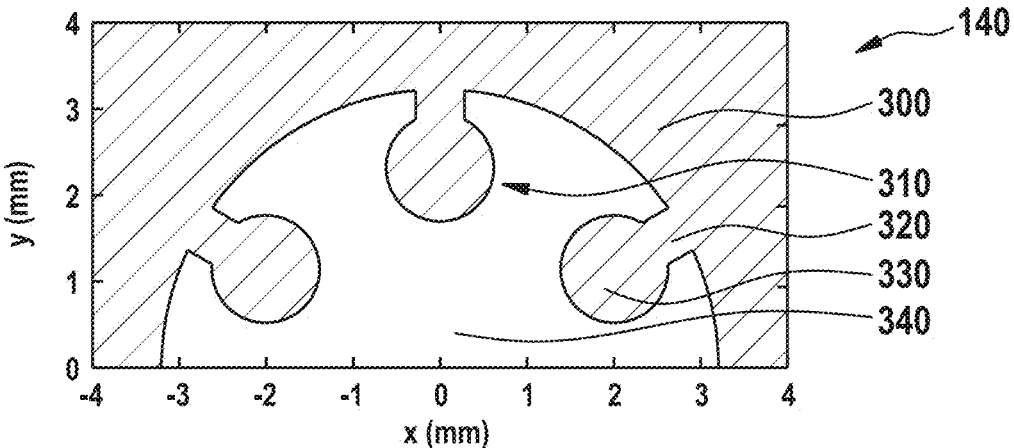
FIG. 4 showing a proximity-electrode including with bulbous ends and cantilevering into the aperture according to embodiments and examples described herein.
Figure 5:
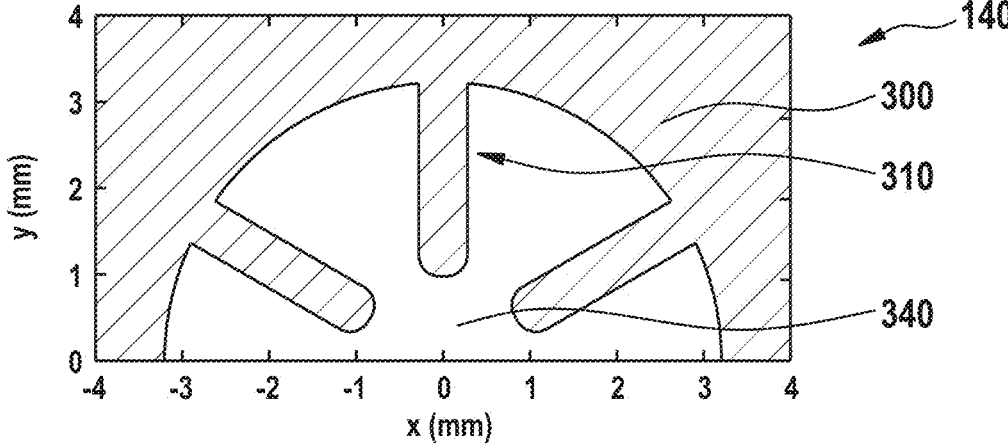
FIG. 5 showing a proximity-electrode including protrusions without bulbous ends and cantilevering into the aperture according to embodiments and examples described herein.
Figure 6:
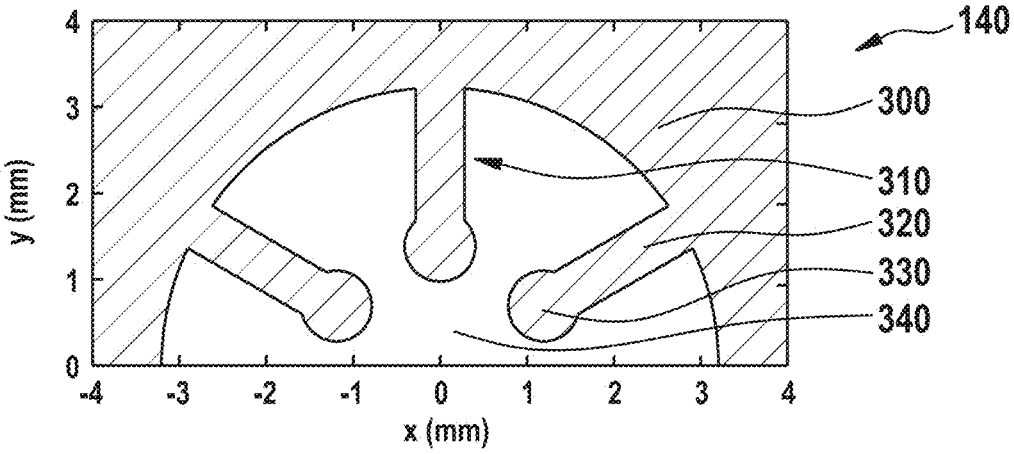
FIG. 6 showing a proximity-electrode including protrusions with bulbous ends and cantilevering into the aperture according to embodiments and examples described herein.

| Design | Proximity-electrode | Clear aperture size (mm²) | Proximity-electrode voltage (at a fixed extraction field) (V) | Peak surface electric field (at a fixed extraction field) ($10^6$ V/m) |
|---|---|---|---|---|
| Baseline | FIG. 1 | 16 | −2319 | 8.9 |
| First | FIG. 2 | 30 | −3067 | 19 |
| Second | FIG. 3 | 28 | −1616 | 12 |
| Third | FIG. 4 | 25 | −1388 | 10 |
| Fourth | FIG. 5 | 27 | −244 | 11 |
| Fifth | FIG. 6 | 26 | −123 | 8.7 |

A baseline proximity-electrode design without an enlarged aperture and without protrusions, as indicated by FIG. 1 and the associated entry in Table 1, is used in the following for comparing the proximity-electrode designs with different extents of aperture enlargement and different extents and designs of protrusions.

The proximity-electrode shown in FIG. 1 is referred to herein as a baseline design. As shown, the proximity-electrode 140 has a body 300 having an aperture 340 within the body 300. The proximity-electrode 140 according to the baseline design includes a (non-enlarged) aperture 340, approximately 2.3 mm in radius and absent protrusions.

The proximity-electrode in FIG. 2 is referred to herein as a first design, which is provided as an example for illustrating features which can be provided singly/separately or combined with other features, as illustrated by aspects and embodiments described herein.

As shown in FIG. 2, the proximity-electrode 140 has a body 300 having an aperture 340 within the body 300. The proximity-electrode 140 according to the first design includes an (enlarged) aperture 340, approximately 3.2 mm in radius, with protrusions 310. As shown, the protrusions 310 cantilever radially into the aperture 340.

As shown in FIG. 2, the protrusions 310 are about 1 mm long, which may be understood as less than halfway towards the center of the aperture or as having a cantilever length less than half of the radius of the aperture.

In comparison to the baseline design, a proximity-electrode according to the first design has a substantially improved clear aperture size (almost doubled), whilst the proximity-electrode voltage is within the same order of magnitude, although peak surface electric field is increased.

Thus, the comparison of the first design to the baseline design shows that by the provision of protrusions 310, clear aperture size can be markedly improved without substantial effect on proximity-electrode voltage, since the increase in field penetration from the enlarged aperture is mitigated by the protrusions.

The proximity-electrode in FIG. 3 is referred to herein as a second design, which is provided as an example for illustrating features which can be provided singly/separately or combined with other features, as illustrated by aspects and embodiments described herein.

As shown in FIG. 3, the proximity-electrode 140 has a body 300 having an aperture 340 within the body 300. The proximity-electrode 140 according to the second design includes an (enlarged) aperture 340, approximately 3.2 mm in radius, with protrusions 310. As shown, the protrusions 310 cantilever radially into the aperture 340.

As shown in FIG. 3, the protrusions 310 are about 1.6 mm long, which may be understood as cantilevering less than halfway towards the center of the aperture 340 or as having a cantilever length less than half of the radius of the aperture 340. The protrusions 310 have bulbous ends 330, which may be understood as ends with enlarged radius, in this example by about 50%, relative to the radius at the middle or stem 320 of the respective protrusion 310.

In comparison to the baseline design, a proximity-electrode according to the second design has a substantially improved clear aperture size (similarly improved as the first design) and a beneficially reduced proximity-electrode voltage (relative to the first design, the second design is almost doubly improved), whilst peak surface electric field is within the same order of magnitude (relative to the first design, is much improved).

Thus, the comparison of the second design to the baseline design shows that by the provision of protrusions 310 with bulbous ends 330 (a bulbous end may be understood as an end having a radius that is enlarged relative to a radius at the middle or stem 320 of the respective protrusion 310), clear aperture size and proximity-electrode voltage can be simultaneously improved, without substantial increase in peak surface electric field.

The proximity-electrode in FIG. 4 is referred to herein as a third design, which is provided as an example for illustrating features which can be provided singly/separately or combined with other features, as illustrated by aspects and embodiments described herein.

As shown in FIG. 4, the proximity-electrode 140 has a body 300 having an aperture 340 within the body 300. The proximity-electrode 140 according to the third design includes an (enlarged) aperture 340, approximately 3.2 mm in radius, with protrusions 310. As shown, the protrusions 310 cantilever radially into the aperture 340.

As shown in FIG. 4, the protrusions 310 are about 1.6 mm long, which may be understood as cantilevering about halfway towards the center of the aperture 340 or as having a cantilever length about half of the radius of the aperture 340. The protrusions 310 have doubly bulbous ends 330, which may be understood as having ends with doubly enlarged radius, in this example by about 100%, relative to the radius at the middle or stem 320 of the respective protrusion.

In comparison to the baseline design, a proximity-electrode according to the third design has a substantially improved clear aperture size (similarly improved as the first and second designs), a beneficially reduced proximity-electrode voltage (relative to the second design, is improved), whilst peak surface electric field is within the same order of magnitude (relative to the first and second designs, is improved).

Thus, the comparison of the third design to the baseline design shows that by the provision of protrusions 310 with doubly bulbous ends (ends having radius at least double of a radius at the middle or stem 320 of the respective protrusion 310), clear aperture size and proximity-electrode voltage can be simultaneously improved, whilst peak surface electric field remains relatively unchanged.

The proximity-electrode in FIG. 5 is referred to herein as a fourth design, which is provided as an example for illustrating features which can be provided singly/separately or combined with other features, as illustrated by aspects and embodiments described herein.

As shown in FIG. 5, the proximity-electrode 140 has a body 300 having an aperture 340 within the body 300. The proximity-electrode 140 according to the third design includes an (enlarged) aperture 340, approximately 3.2 mm in radius, with protrusions 310. As shown, the protrusions 310 cantilever radially into the aperture 340.

As shown in FIG. 5, the protrusions 310 are about 2.2 mm long, which may be understood as cantilevering more than halfway towards the center of the aperture 340 or as having a cantilever length more than half of the radius of the aperture 340.

In comparison to the baseline design, a proximity-electrode according to the fourth design has a substantially improved clear aperture size (similarly improved as the first, second and third designs), substantially improved proximity-electrode voltage (relative to the first, second and third designs, is an order of magnitude better), whilst peak surface electric field is within the same order of magnitude (similar to the second and third designs).

Thus, the comparison of the fourth design to the baseline design shows that by the provision of protrusions cantilevering more than halfway towards the center of the aperture, or having a cantilever length more than half of a radius of the aperture, clear aperture size and proximity-electrode voltage can be tremendously improved without much change in peak surface electric field.

The proximity-electrode in FIG. 6 is referred to herein as a fifth design, which is provided as an example for illustrating features which can be provided singly/separately or combined with other features, as illustrated by aspects and embodiments described herein.

As shown in FIG. 6, the proximity-electrode 140 has a body 300 having an aperture 340 within the body 300. The proximity-electrode 140 according to the fifth design includes an (enlarged) aperture 340, approximately 3.2 mm in radius, with protrusions 310. As shown, the protrusions 310 cantilever radially into the aperture 340.

As shown in FIG. 6, the protrusions 310 are about 2.2 mm long, which may be understood as cantilevering more than halfway towards the center of the aperture 340 or as having a cantilever length more than half of the radius of the aperture 340. The protrusions 310 have bulbous ends 330, which may be understood as having ends with enlarged radius, in this example by about 50%, relative to the radius at the middle or stem 320 of the respective protrusion.

In comparison to the baseline design, a proximity-electrode according to the fifth design has not only a substantially improved clear aperture size (similarly improved as the first, second, third and fourth designs) and a substantially improved proximity-electrode voltage (similarly improved as the fourth design), but even an improved peak surface electric field.

Thus, the comparison of the fifth design to the baseline design shows that by the provision of protrusions cantilevering more than halfway towards the center of the aperture, or having a cantilever length more than half of a radius of the aperture, and having bulbous ends 330 (ends having radius enlarged relative to a radius at the middle or stem 320 of the respective protrusion 310), all of clear aperture size, proximity-electrode voltage and peak surface electric field can be improved, in particular clear aperture size and proximity-electrode voltage.

Further aspects, embodiments and examples of the proximity-electrode are described in the following.

Figure 7:
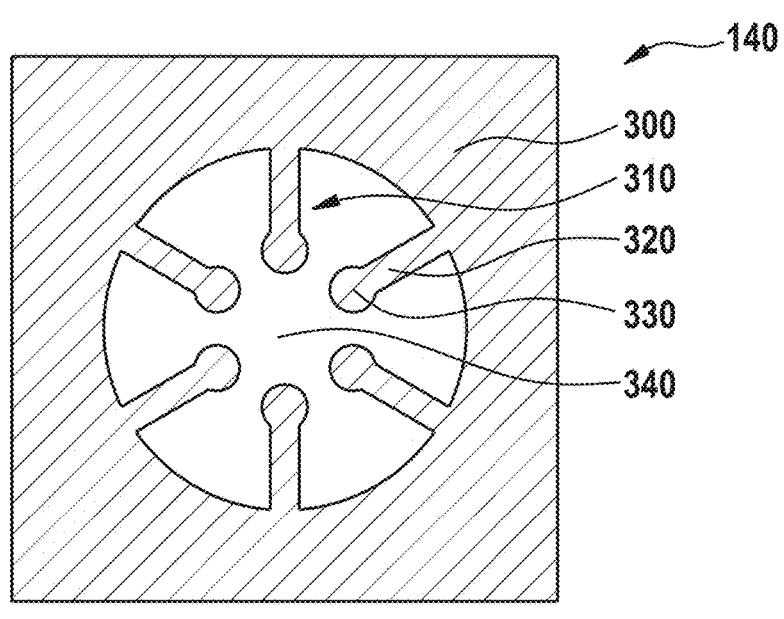
FIG. 7 showing a proximity-electrode according to aspects, embodiments and examples described herein.

FIG. 7 showing a proximity-electrode according to aspects and embodiments described herein.

According to an aspect, a proximity-electrode 140 for a charged particle beam device includes a body 300 having an aperture 340 within the body 300; and the body having a plurality of protrusions 310 cantilevering radially into the aperture 340, the aperture 340 and the protrusions 310 having an n-fold rotational symmetry, n being an integer.

Beneficially, a proximity-electrode with a large clear aperture size, low field penetration through the proximity-electrode thus low proximity-electrode voltage and minimal shadowing is provided.

According to an embodiment, which can be combined with other embodiments, the protrusions 310 have a minimum radius of curvature such that a maximum magnitude of a surface electric field on the protrusions 310 is less than 3 times a maximum magnitude of a surface electric field on a body 300 of the proximity-electrode 140.

According to an embodiment, which can be combined with other embodiments, each protrusion 310 has a minimum radius of curvature that is at least half of a width of the protrusion 310.

Beneficially, edges are rounded and a proximity-electrode with low field penetration through the proximity-electrode thus low proximity-electrode voltage and reduced peak surface electric field can be attained.

According to an embodiment, which can be combined with other embodiments, a tip or end 330 of each protrusion 310 has a minimum radius of curvature at least equal to, preferably larger than, a minimum radius of curvature at a middle or stem 320 of the respective protrusion 310.

Beneficially, protrusion tips are especially rounded and a proximity-electrode with reduced peak surface electric field is provided, and further, low field penetration through the proximity-electrode thus low proximity-electrode voltage is provided.

According to an embodiment, which can be combined with other embodiments, a length of each protrusion 310 is at least 5% of a radius of the aperture 340 and at most 80% of a radius of the aperture 340.

According to an embodiment, which can be combined with other embodiments described herein, a length of each protrusion 310 is at least 5% of a radius of the aperture 340 and/or at most 80% of a radius of the aperture (in a plane of the aperture or perpendicular to an axis of the proximity-electrode 140, to an optical axis of the charged particle beam device, and/or to an axis of the primary charged particle beam).

According to an embodiment, which can be combined with other embodiments described herein, a length of each protrusion 310 is more than 50% and/or less than 80% of a radius of the aperture 340 (in a plane of the aperture 340 or perpendicular to an axis of the proximity-electrode 140, to an optical axis of the charged particle beam device, and/or to an axis of the primary charged particle beam).

Beneficially, low field penetration is provided, which is particularly beneficial when provided in combination with a large aperture. Furthermore, the provision of protrusion lengths extending substantially into the aperture, without contacting each other and without distorting the primary charged particle beam, beneficially enables a proximity-electrode with a large clear aperture size with minimal field penetrating through the proximity-electrode, minimal proximity-electrode voltage and minimal peak surface electric field.

It may be understood that the tip or end 330 of each protrusion 310 is unsupported, free and/or does not contact or connect with a body 300 of the proximity-electrode 140, or (any part of) another protrusion 310 of the proximity-electrode 140.

It may be understood that a length of each protrusion 310 is a length in a direction of an axis of the protrusion 310, in a plane of the aperture 340, in a direction perpendicular to an axis of the proximity-electrode 140, and/or in a direction perpendicular to an optical axis of the charged particle beam device.

According to an embodiment, which can be combined with other embodiments, a radius of the aperture 340 is at least 1.5 mm and/or at most 5.5 mm, preferably at least 2 mm and/or at most 5 mm, more preferably at least 2.5 mm and/or at most 4.5 mm, or most preferably at least 3 mm and/or at most 4 mm.

According to an embodiment, which can be combined with other embodiments, an aperture size, a clear aperture size or a clear area of the aperture 340 in a plane of the aperture 340 is at least 10 mm$^2$ and/or at most 95 mm$^2$, preferably at least 15 mm$^2$ and/or at most 80 mm$^2$, more preferably at least 20 mm$^2$ and/or at most 65 mm$^2$, or most preferably at least 25 mm$^2$ and/or at most 50 mm$^2$.

Beneficially, the aperture has a large clear aperture size, which is particularly beneficial, when provided in combination with the protrusions and embodiments thereof.

According to an embodiment, which can be combined with other embodiments, the proximity-electrode 140 is aligned with at least one detector (in particular a backscattered electron detector, i.e. BSE detector 134, and/or energy-dispersive X-ray spectroscopy detector, i.e. EDX detector) configured to detect signal charged particles emanating from the sample and traversing through the aperture 340 including through an outside of a central circle of the aperture 340.

In an example, backscattered charged particles, such as backscattered electrons, are typically fast and therefore less susceptible to an accelerating field, such as an accelerating field of a proximity-electrode. Accordingly, backscattered charged particles, including backscattered electrons, spread or emanate across a wide angle, far away from the optical axis. Therefore, a proximity-electrode with a larger opening is particularly beneficial for working with a backscattered charged particle detector (e.g. backscattered electron detector) arranged for detecting the signal charged particles (e.g. backscattered charged particles/backscattered electrons).

According to an embodiment, which can be combined with other embodiments, one, or in particular both, of the proximity-electrode and the detector is/are arranged such that signal charged particles traversing through the aperture of the proximity-electrode including through an outside of a central circle of the aperture impinge on the detector, in particular, impinge directly on the detector and/or impinge on the detector without an electrode therebetween and/or impinge on the detector without an electrode between the proximity-electrode and the detector. In a particular example, the detector is a backscattered charged particle detector or a backscattered electron detector.

It may be understood that the central circle is within a plane of the aperture 340. It may be understood that a center of the central circle is aligned with a center of the aperture 340 or a central axis of the proximity-electrode 140. It may be understood that the central circle is clear of the protrusions 310 or absent of the protrusions 310. It may be understood that the central circle extends up to an end or a tip of one, preferably all, of the protrusions 310.

Beneficially, more signal charged particles and wider-angle signal charged particles can traverse the proximity-electrode and be collected/detected without undesirably increasing field penetration from the column above.

According to an embodiment, which can be combined with other aspects and embodiments (for example, the protrusions 310 extending radially into the aperture 340), all areas of the aperture 340 are contiguous with each other in a plane of the aperture 340. Beneficially, shadowing is minimized for a large aperture area, allowing improved signal charged particle detection and/or imaging.

According to an embodiment, which can be combined with other embodiments, an unsupported tip or end 330 of each protrusion 310 has a bulbous shape (which may be understood as having ends with enlarged radius relative to the radius at the middle or stem 320 of the respective protrusion), and/or is adapted to decrease a surface electric field at the unsupported tip or end 330.

According to an embodiment, which can be combined with other embodiments described herein, a radius or width of the tip or end 330 of (each of) the protrusions is at least as large, preferably larger, than a radius or width of a middle or stem 320 of the respective protrusion 310.

According to an embodiment, which can be combined with other embodiments described herein, a radius or width of the tip or end 330 of (each of) the protrusions is at most twice of a radius or width of a middle or stem 320 of the respective protrusion 310.

According to some embodiments, which can be combined with other embodiments described herein, the (unsupported and/or free) tip or end 330 of one or more, preferably all, protrusions 310 has respectively a bulbous shape or a radius larger than a radius at a middle or stem 320 of the respective protrusion 310.

According to some embodiments, which can be combined with other embodiments described herein, the (unsupported and/or free) tip or end 330 of one or more, preferably all, protrusions 310 is respectively adapted to have a reduced/low surface electric field, in particular at the (free and/or unsupported) tip or end 330.

Beneficially, protrusion ends are rounded, and a proximity-electrode with reduced peak surface electric field and low field penetrating through the proximity-electrode thus low proximity-electrode voltage is attained.

It may be understood that a protrusion 310 has (only) one (unsupported and/or free) tip or end 330. It may be understood that an unsupported and/or free tip or end 330 of a protrusion 310 is arranged at an opposite end to a base or supported end of the protrusion 310. It may be understood that a protrusion 310 is supported or cantilevered at a base of the protrusion 310. It may be understood that each of the one or more protrusions is supported by or cantilevered from the body 300 of the proximity-electrode 140.

Aspects, embodiments and examples of the retarding field device are described as follows.

Figure 8:
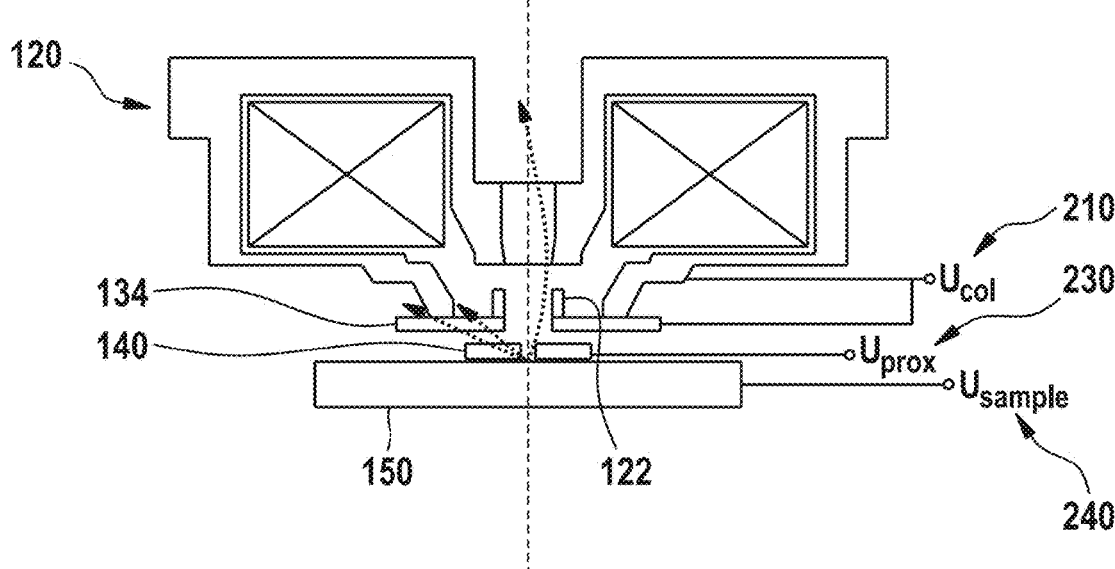
FIG. 8 showing a retarding field device including a proximity-electrode according to embodiments and examples described herein.

FIG. 8 shows a retarding field device including a proximity-electrode according to aspects and embodiments described herein.

According to an aspect, a retarding field device, for retarding the primary charged particle beam before the primary charged particle beam impinges on a sample 150, includes an objective lens 120 and a proximity-electrode 140 arranged downstream of (a principal plane of) the objective lens 120.

It may be understood that the retarding field device is configured to reduce energy of the primary charged particle beam in the column to a landing energy for landing on the sample 150. The retarding field device may be configured to decelerate the primary charged particle beam and accelerate signal charged particles. In an example, the objective lens 120 and the proximity-electrode 140 may be configured, in combination, to focus the primary charged particle beam.

According to an embodiment, which can be combined with other aspects and embodiments, the proximity-electrode 140 is arranged proximate to the objective lens 120 or within an effective field of the objective lens 120.

According to an embodiment, which can be combined with other aspects and embodiments, the proximity-electrode 140 is adjacent to or proximate to the sample 150 and/or sample stage. According to an embodiment, the proximity-electrode 140 is configured to control or provide control of an extraction field, in particular in a space between the proximity-electrode 140 and the sample 150 or sample stage.

The extraction field may be understood as a field for extracting signal charged particles from the sample 150 and/or to accelerate signal charged particles from the sample 150. The extraction field may be controlled or provided by the proximity-electrode 140. It may be understood that collection of signal charged particles can be controlled by controlling the extraction field.

The proximity-electrode 140 may be configured to control the extraction field strength for extracting signal charged particles. It may be understood that the extraction field in the extraction region between the sample and the proximity-electrode can be controlled by applying a predetermined electric potential $U_{prox}$, 230, to the proximity-electrode 140.

According to an embodiment, which can be combined with other aspects and embodiments, the proximity-electrode 140 is arranged or configured to be a last element of a retarding field device or of a charged particle beam device in a direction of a primary charged particle beam before the primary charged particle beam impinges on a sample 150.

The proximity-electrode 140 may be arranged adjacent to the sample 150 and/or without electrodes and/or elements between the proximity-electrode 140 and the sample 150. It may be understood that a distance between the proximity-electrode 140 and the sample 150 or the sample stage is smaller than a distance between the objective lens 120 and the sample 150 or the sample stage.

In an example, a distance between the proximity-electrode 140 and the sample 150 or sample stage, in particular operative distance or working distance or distance during operation, is 10 mm or less, preferably 6 mm or less, more preferably 4 mm or less, and most preferably 2 mm or less.

Beneficially, a small distance between the proximity-electrode 140 and the sample 150 allows large-angle signal charged particles to be collected through the aperture of the proximity-electrode 140.

According to an embodiment, which can be combined with other aspects and embodiments, the proximity-electrode 140 may be configured to decelerate the primary charged particle beam, in particular as a (most downstream) component or electrode of the retarding field device.

According to an embodiment, which can be combined with other aspects and embodiments, the proximity-electrode 140 is adapted to be at a more negative potential than a column potential, $U_{col}$ 210.

In an example, the proximity-electrode 140 is at a potential, $U_{prox}$, 230 such that a potential difference between the potential of the proximity-electrode, $U_{prox}$, 230 and a potential of the column of the charged particle beam device, $U_{col}$ 210, a potential of the first detector, $U_{det}$, and/or a potential the objective lens, $U_{obj}$ is adapted to decelerate the primary charged particle beam before impingement on the sample.

Beneficially, a retarding field device is provided.

In an example, the proximity-electrode 140 is at a potential, $U_{prox}$, 230 such that the proximity-electrode is at a more negative potential than a potential of a column of the charged particle beam device, $U_{col}$ 210 (e.g. a potential of the first detector, $U_{det}$, or the objective lens, $U_{obj}$).

In an example, a retarding field device provides a potential difference between the sample 150 (sample potential, $U_{sample}$ 240) and a column of the charged particle beam device (column potential, $U_{col}$ 210), for example, of 5 keV or more, 15 keV or more, or 30 keV or more, and/or 100 keV or less, 80 keV or less, or 60 keV or less.

It may be understood that (the aperture of) the proximity-electrode is adapted for passage of both a primary charged particle beam and signal charged particles. It may be understood that the primary charged particle beam and signal particles propagate, in different, for example (substantially) opposite directions, through the proximity-electrode, in particular through the aperture.

It may be understood that the proximity-electrode 140 is configured to allow the primary charged particle beam to traverse the proximity-electrode through an aperture of the proximity-electrode 140 to impinge on a sample 150.

It may be understood that the proximity-electrode 140 is adapted to allow signal particles emanating from the sample to traverse the proximity-electrode 140 (through the aperture of the proximity-electrode 140).

According to embodiments, the size of the aperture (clear aperture size) of the proximity-electrode 140 is 5 mm² or more, preferably 10 mm² or more, more preferably 15 mm² or more and most preferably 20 mm² or more.

According to embodiments, a diameter or (in-plane) width of the aperture of the proximity-electrode 140 is at least 5 times a distance between the proximity-electrode 140 and the sample 150 or sample stage, or at least 5 times a height of a space between the proximity-electrode 140 and the sample 150 or sample stage.

Beneficially, it is provided a proximity-electrode with a large aperture which allows more signal charged particles through to be collected.

The proximity-electrode 140 may be configured to enable traversal of signal charged particles emitted at an angle of 5 degrees or more, preferably 10 degrees or more, or most preferably 15 degrees or more. The angle of the signal charged particle emitted may be understood as being with respect to the optical axis of the charged particle beam device and/or to the axis of the proximity-electrode 140.

According to embodiments, the size of the aperture of the proximity-electrode 140 and the distance between the proximity-electrode 140 are such that signal charged particles from the sample 150, emitted at an angle of 5 degrees or more, preferably 10 degrees or more, or more preferably 15 degrees or more, passes through the aperture of the proximity-electrode 140.

Aspects, embodiments and examples of a charged particle beam device are described as follows.

Figure 9:
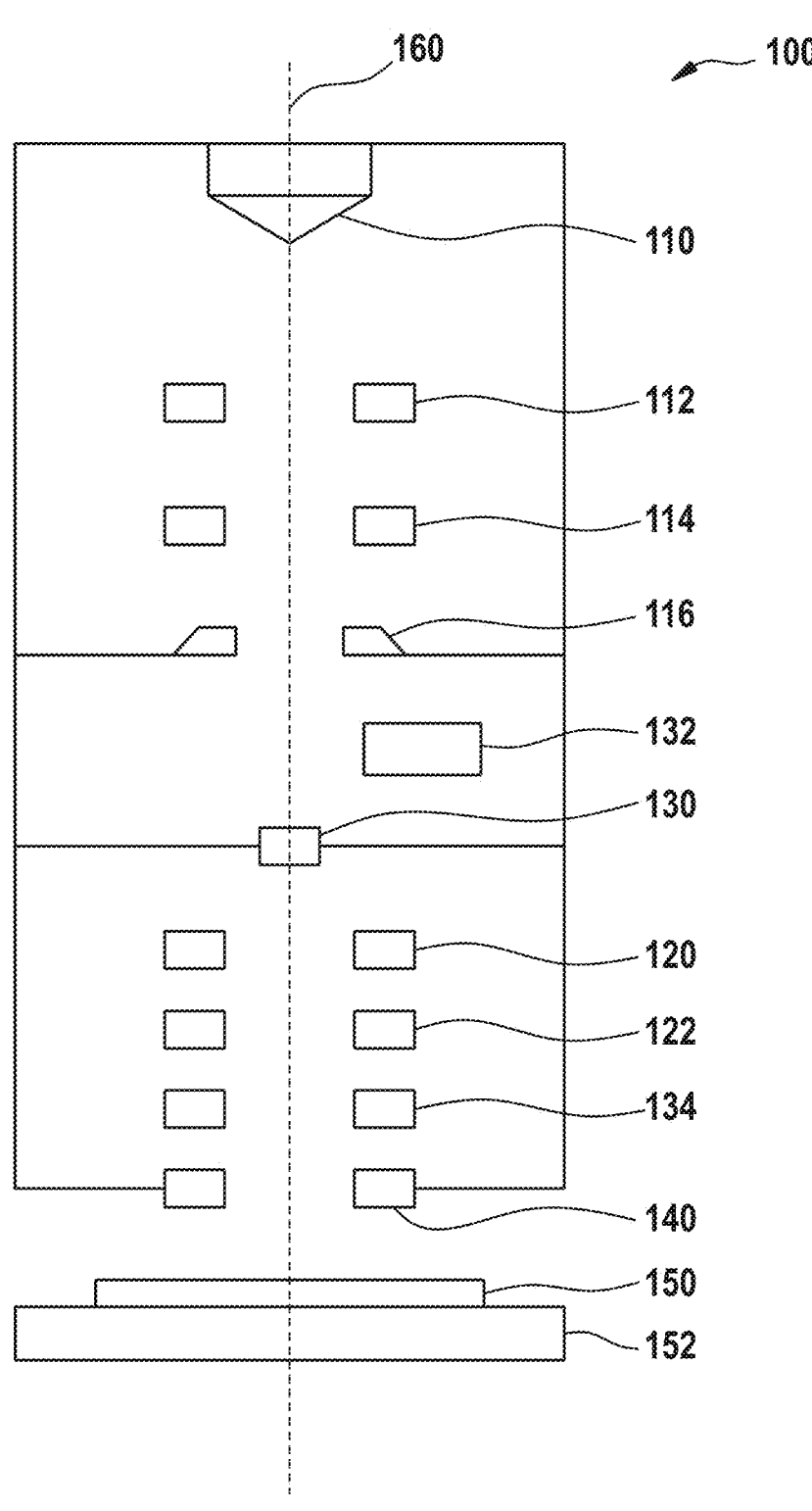
FIG. 9 showing a charged particle beam device including a proximity-electrode according to aspects, embodiments and examples described herein.

FIG. 9 shows a charged particle beam device according to aspects and embodiments described herein.

According to an aspect, a charged particle beam device 100, for at least one of imaging and inspecting a sample, includes a beam emitter 110 for emitting a primary charged particle beam; and a retarding field device for retarding the primary charged particle beam before the primary charged particle beam impinges on the sample 150, the retarding field device including an objective lens 120 and a proximity-electrode 140 arranged downstream of (a principal plane of) the objective lens 120; wherein the charged particle beam device 100 is adapted for guiding the primary charged particle beam along an optical axis 160 to the sample 150 for generating signal charged particles from the sample 150.

The beam emitter 110 for emitting a primary charged particle beam may be a charged particle source, such as a cold field emitter (CFE) or a thermal field emitter (TFE) (e.g. a Schottky emitter). The beam emitter 110 may be a high current and/or high brightness source. A high current source may be understood as a source configured to produce at least 5 µA in 100 mrad.

The charged particle beam device may include a charged particle suppressor (not shown), a condenser lens 112, and/or deflectors 114 (which may be beam alignment deflectors and/or configured for aligning the primary charged particle beam to a beam limiting aperture 116. The beam limiting aperture 116 may be arranged between the beam emitter 110 and the objective lens 120. The beam limiting aperture 116 may be arranged to separate a first chamber that includes the beam emitter 110 from a further chamber or further chambers, e.g. a second chamber or a second chamber including the objective lens 120.

It may be understood that the objective lens 120 is configured to focus the primary charged particle beam on the sample 150. In an example, the objective lens 120 includes an upper pole piece and a lower pole piece and a coil forming a magnetic lens component of the objective lens 120 (shown in FIG. 8). The objective lens 120 may include one or more electrodes forming an electrostatic lens component of the objective lens. The magnetic lens component and the electrostatic lens component may overlap to form a compound objective lens.

In an example, the charged particle beam device includes a column. The column may be at ground potential. In an example, when the column is at ground potential, detection with the first and/or second detector, in particular with one or more semiconductor detectors, such as pin diodes, can be practicable, since both the detector and detector electronics can be set at ground potential.

It may be understood that the charged particle beam device 100 is configured to guide the primary charged particle beam through a column of the charged particle beam device 100. The interior of the column may be understood to be evacuated and/or at sub-atmospheric pressure, for example at a pressure of 1 mbar or less, $10^{-5}$ mbar or less, or even $10^{-8}$ mbar or less (ultra-high vacuum). In an embodiment, the charged particle beam device includes a vacuum housing. The beam emitter and the objective lens may be arranged inside the vacuum housing of the charged particle beam device.

In an example, the charged particle beam device 100 may include a scan deflector 122 (shown in FIG. 8). The scan deflector 122 may be configured for scanning the primary charged particle beam over (a surface of) the sample 150.

It may be understood that an axis of the proximity-electrode 140, in particular of the aperture of the proximity-electrode 140, is aligned with an optical axis 160 of the charged particle beam device 100, with the primary charged particle beam and/or with an axis of the objective lens 120. In an example, the optical axis 160 of the charged particle beam device 100 and the axis of the proximity-electrode 140, in particular of the aperture of the proximity-electrode 140, is collinear and/or coincident.

In an example, the charged particle beam device 100 includes one or more detectors configured to detect signal charged particles emanating from the sample 150 and traversing through (the aperture of) the proximity-electrode 140, preferably including through the outside of the central circle of the aperture of the proximity-electrode 140, the central circle being clear of protrusions and extending up to an end of a protrusion of the proximity-electrode 140.

In an example, the proximity-electrode 140 is aligned with at least one of the one or more detectors, e.g. with a BSE detector 134 (shown in FIG. 8).

According to an embodiment, which can be combined with other aspects and embodiments, the proximity-electrode 140 is arranged to be a last element of a charged particle beam device 100 in a direction of a primary charged particle beam before the primary charged particle beam impinges on a sample 150. Beneficially, the proximity-electrode is adjacent or proximate to the sample, and facilitates suitable impingement energy of the primary charged particle beam and extraction of signal charged particles.

In an example, the proximity-electrode 140 is arranged adjacent to or at a front end of the vacuum housing of the charged particle beam device 100 and/or protrudes into a sample chamber where a sample 150 and/or a sample stage 152 is arranged. In an example, the sample chamber may be configured for a sub-atmospheric pressure, e.g., a high vacuum. In an example, the vacuum housing of the charged particle beam device 100 may be configured for an ultra-high vacuum and/or for a higher vacuum or lower pressure than the sample chamber.

The charged particle beam device 100 may include a sample stage 152 configured for supporting a sample 150. The sample stage 152 may have a support surface, in particular extending in an x-y-plane. The sample 150 may be placed on a sample stage 152 of the charged particle beam device 100.

It may be understood that on impingement of the primary charged particle beam on the sample 150, signal charged particles, for example, secondary (SE) and/or backscattered charged particles (BSE), which may be understood to be detectable by at least one of the one or more detectors (e.g. BSE detector 134, SE detector 132), are emitted or emanate from the sample 150.

According to an embodiment, which can be combined with other aspects and embodiments, the charged particle beam device 100 includes a first detector, preferably configured to detect backscattered signal charged particles, i.e. a BSE detector 134. The first detector may be arranged between the objective lens 120 and a sample 150 or sample stage 152. The first detector may be preferably arranged between the proximity-electrode 140 and the objective lens 120. In an example, the first detector is a semiconductor detector, for example a PIN diode.

It may be understood that signal charged particles, for example backscattered electrons, traversing the proximity-electrode 140 can be accelerated towards a first detector, e.g. a BSE detector 134, such that detection is efficient. In an example, by setting the first detector at a respective potential, the first detector may function as an acceleration electrode to accelerate signal charged particles.

It may be understood that accelerating signal charged particles, in particular backscattered charged particles, is particularly beneficial for detecting signal charged particles at low landing energy settings. This is beneficial at landing energies below 10 keV, below 3 keV or even below 1 keV, and for detecting backscattered electrons that lose energy travelling through the sample, for example when being backscattered from deeper within the sample or from a deep trench or features with a high-aspect ratio.

The first detector may be a multi-channel backscattered electron detector, preferably including a plurality of detection segments, the signals of which can be individually processed, e.g., individually mixed and/or combined. The signal(s) from the first detector, in particular from the plurality of detection segments, may be combined for compositional imaging and/or individually processed for improving the topographic contrast.

The first detector may be an in-lens detector. The first detector may have an annular detection surface. An axis of the first detector may be collinear or coincident with the optical axis of the charged particle beam device and/or with the axis of the proximity-electrode 140. In some embodiments, the first detector is an in-lens detector with a hole that allows a passage of the primary charged particle beam and with an annular detection surface surrounding the hole.

According to an embodiment, which can be combined with other aspects and embodiments, the charged particle beam device 100 includes one or more of at least one of electrodes, deflectors 114, and/or lenses (e.g. condenser lens 112 and/or objective lens 120), for guiding the primary charged particle beam along an optical axis to the sample for generating signal charged particles from the sample 150. The charged particle beam device 100 may be configured to image and/or inspect a sample 150 based on signal charged particles emanating from the sample 150.

The charged particle beam device 100 may include a beam separator 130 configured to separate the primary charged particle beam from signal charged particles, preferably arranged between the beam emitter 110 and the objective lens 120. The beam separator 130 may include at least one magnetic deflector, such that the signal charged particles are deflected away from the optical axis 160 of the charged particle beam device 100. In an example, the beam separator is a Wien filter.

The charged particle beam device 100 may include a second detector (e.g. SE detector 132) configured for detecting signal charged particles, preferably secondary signal charged particles (e.g. secondary electrons). The second detector may be configured to detect signal charged particles separated from the primary charged particle beam by the beam separator 130. The second detector may be arranged between the objective lens 120 and the beam emitter 110. In an example, the second detector is a secondary electron detector.

Figure 10:
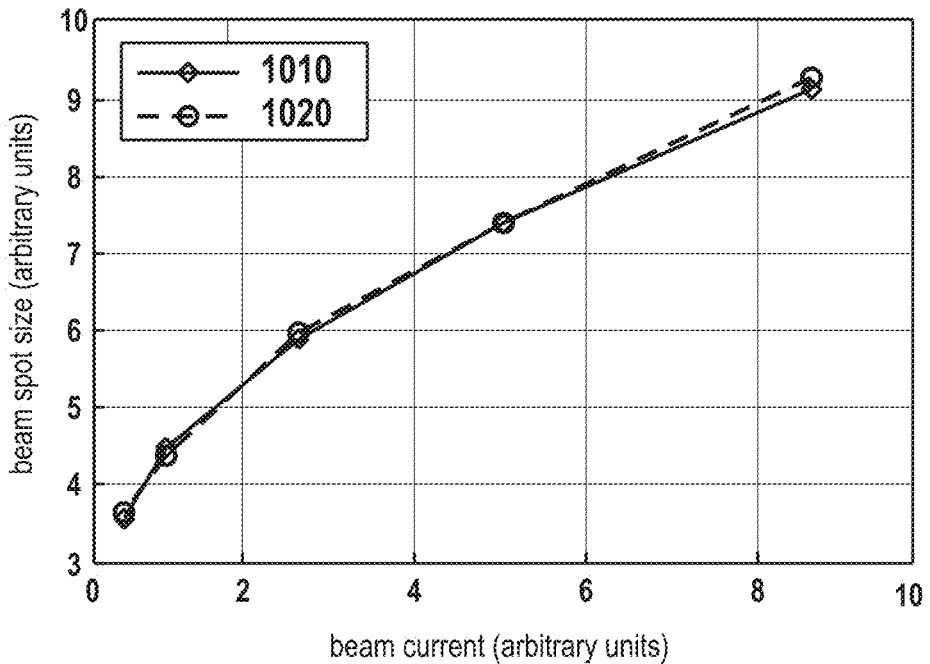
FIG. 10 showing beam spot size performance according to embodiments and examples described herein.

FIG. 10 shows the relative primary beam spot sizes for various beam currents for a charged particle beam device with a proximity-electrode according to the first design 1010 and with a proximity-electrode according to the baseline design 1020. As shown, a charged particle beam device having a proximity-electrode having protrusions has substantially similar primary charged particle beam spot size to a primary charged particle beam device having a proximity-electrode without protrusions. Accordingly, a proximity-electrode according to embodiments and examples as described herein may provide corresponding benefits without distorting the primary charged particle beam.

Aspects, embodiments and examples of a method for imaging and/or inspection of a sample are described in the following.

Figure 11:
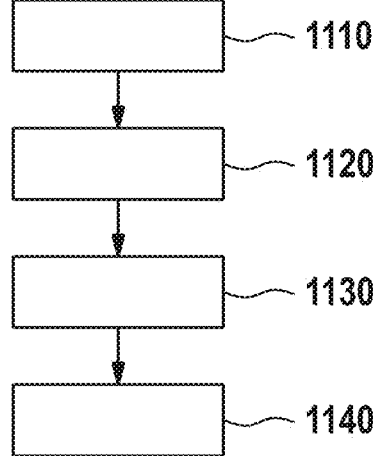
FIG. 11 showing a method for imaging and/or inspection of a sample according to aspects, embodiments and examples described herein.

FIG. 11 illustrates a method for imaging and/or inspection of a sample using a charged particle beam device having a proximity-electrode according to aspects and embodiments described herein.

According to an aspect, a method for imaging and/or inspection of a sample 150 using a charged particle beam device 100 having the proximity-electrode 140 may include emitting a primary charged particle beam 1110; guiding the primary charged particle beam through a column of the charged particle beam device 1120; and focusing 1130 and retarding the primary charged particle beam with the retarding field device 1140.

According to embodiments, which can be combined with other embodiments describe herein, the proximity-electrode 140 includes a central circle within a plane of the aperture of the proximity-electrode 140 that is clear of the protrusions, and the method includes guiding the primary charged particle beam through the aperture, in particular, (substantially or wholly) through the central circle.

According to some embodiments, the proximity-electrode 140 includes a central circle within a plane of the aperture of the proximity-electrode 140 that is clear of the protrusions, and the method includes detecting signal charged particles traversing through (the aperture of) the proximity-electrode 140, preferably including through the outside of the central circle of the aperture of the proximity-electrode 140.

According to some embodiments, the proximity-electrode 140 is arranged to be a last element of a charged particle beam device in a direction of a primary charged particle beam before the primary charged particle beam impinges on a sample, and the method includes setting the proximity-electrode including/having the protrusions, at a potential adapted to reduce a penetration of a column field through the proximity-electrode and onto the sample.

In an example, the phrase 'at a potential adapted to reduce a penetration of a column field' may be understood as meaning: wherein the penetration of the column field through the proximity-electrode, when the proximity-electrode is set at said potential, is less in comparison to a penetration of the column field, when the proximity-electrode is set at a potential equal to a potential of the column.

The charged particle beam device may be for imaging and/or inspecting a sample, for example for at least one of critical dimension measurement, defect review, charged particle beam mask inspection, and metrology and inspection processes such as charged particle beam metrology and hotspot inspection, and charged particle beam wafer inspection.

Further, imaging and/or inspection of a sample may be understood as the imaging and/or inspection of 3D structures, for example semiconductor samples such as wafers, and/or features such as FinFETs and NANDs.

In the present disclosure, proximity-electrode, charged particle beam device, components thereof and methods in connection therewith exemplarily refer to electrons without limitation. The term electrons particularly encompass secondary electrons and/or backscattered electrons, specifically both secondary and backscattered electrons (SEs and BSEs). However, it is to be understood that aspects, embodiments and examples described herein can be applied to other corpuscles such as secondary and/or backscattered charged particles in the form of positive or negative ions in order to obtain a sample image or inspection result. Accordingly, in aspects, embodiments and examples described herein, proximity-electrode, charged particle beam device, components thereof and methods in connection therewith are not limited to electrons and may refer to charged particles.

A "specimen", "sample" or "wafer" as referred to herein includes, but is not limited to, semiconductor wafers, semiconductor workpieces, and other workpieces such as memory disks and the like. A "sample" may specifically be any workpiece that is structured or on which material is deposited. A specimen, a sample or wafer may include a surface that is to be inspected and/or imaged, e.g. a surface that is structured or on which layers or a material pattern have been deposited. For example, a sample may be a substrate or a wafer on which a plurality of electronic devices is provided that are to be inspected. According to aspects, embodiments and examples, the devices and methods described herein relate to charged particle or electron beam inspection (EBI), critical dimension measurement and defect review applications, where the devices and methods described herein can be beneficially used to obtain an increased throughput and an improved detection accuracy. According to aspects, embodiments and examples, a charged particle device or electron beam inspection (EBI) device, critical dimension measurement (CD) tool, and/or defect review (DR) tool can be provided, wherein high resolution, large field of view, and high scanning speed can be achieved.

Numbered examples are described in the following.

According to Example 1, it is provided a proximity-electrode for a charged particle beam device, including a body having an aperture within the body; and the body having a plurality of protrusions cantilevering radially into the aperture, the aperture and the protrusions having an n-fold rotational symmetry, n being an integer.

According to Example 2, it is provided a proximity-electrode according to Example 1, wherein a minimum radius of curvature of each of the plurality of protrusions is more than 5% of a width and/or a diameter of the respective protrusion and/or wherein the protrusions have a minimum radius of curvature such that a maximum magnitude of a surface electric field on the protrusions is less than 3 times a maximum magnitude of a surface electric field on a body of the proximity-electrode.

According to Example 3, it is provided a proximity-electrode according to Example 1 or 2, wherein a minimum radius of curvature of each of the protrusions in a plane perpendicular to a plane of the proximity-electrode and/or in a plane perpendicular to a plane of the aperture of the proximity-electrode is larger than a minimum radius of curvature of the respective protrusion in a plane of the proximity-electrode and/or in a plane of the aperture of the proximity-electrode.

According to Example 4, it is provided a proximity-electrode according to any of Examples 1 to 3, wherein a minimum radius of curvature at a free end and/or at a tip of each protrusion is equal to or larger than a half of a width at a middle and/or at a stem of the respective protrusion.

According to Example 5, it is provided a proximity-electrode according to any of Examples 1 to 4, wherein an unsupported end of each protrusion has a bulbous shape adapted to decrease a surface electric field at the unsupported end.

According to Example 6, it is provided a proximity-electrode according to any of Examples 1 to 5, wherein a length of each protrusion is at least 5% of a radius of the aperture and at most 80% of a radius of the aperture.

According to Example 7, it is provided a proximity-electrode according to any of Examples 1 to 6, wherein a clear area of the aperture in a plane of the aperture is at least 10 mm$^2$.

According to Example 8, it is provided a proximity-electrode according to any of Examples 1 to 7, the proximity-electrode further including a central circle within a plane of the aperture, the central circle being clear of the protrusions and extending up to an end and/or a tip of one or all of the protrusions.

According to Example 9, it is provided a proximity-electrode according to any of Examples 1 to 8, wherein the proximity-electrode is aligned with at least one detector configured to detect signal charged particles emanating from the sample and traversing through the aperture including outside of the circle and/or wherein the proximity-electrode is arranged such that signal charged particles emanating from the sample and traversing through the aperture including outside of the circle impinge on a backscattered charged particle detector.

According to Example 10, it is provided a proximity-electrode according to any of Examples 1 to 9, wherein all areas of the aperture are contiguous with each other in a plane of the aperture.

According to Example 11, it is provided a charged particle beam device for at least one of imaging and inspecting a sample, the charged particle beam device including a beam emitter for emitting a primary charged particle beam; and a retarding field device for retarding the primary charged particle beam before the primary charged particle beam impinges on the sample, the retarding field device including an objective lens and a proximity-electrode according to any of Examples 1 to 10, the proximity-electrode being arranged downstream of a principal plane of the objective lens; wherein the charged particle beam device is adapted for guiding the primary charged particle beam along an optical axis to the sample for generating signal charged particles from the sample.

According to Example 12, it is provided a charged particle beam device according to Example 11, wherein the proximity-electrode is arranged to be a last element of a charged particle beam device in a direction of a primary charged particle beam before the primary charged particle beam impinges on a sample.

According to Example 13, it is provided a charged particle beam device according to Example 11 or 12, wherein a diameter of the aperture of the proximity-electrode is at least 3 times a height of a space between the proximity-electrode and the sample.

According to Example 14, it is provided a charged particle beam device according to any of Examples 11 to 13, wherein the proximity-electrode is adapted to be at a more negative potential than a column potential.

According to Example 15, it is provided a charged particle beam device according to any of Examples 11 to 14, wherein the proximity-electrode is arranged proximate to the objective lens and/or within an effective field of the objective lens.

According to Example 16, it is provided a charged particle beam device according to any of Examples 11 to 15, wherein a diameter of the circle is at least twice a height of a space separating the proximity-electrode and a sample.

According to Example 17, it is provided a method for at least one of imaging and inspection of a sample using a charged particle beam device having the proximity-electrode according to any of Examples 1 to 10.

According to Example 18, it is provided a method according to Example 17, wherein the proximity-electrode is according to any of Examples 8 to 10, the method further including guiding the primary charged particle beam through the aperture, through the central circle.

According to Example 19, it is provided a method according to Example 17 or 18, wherein the proximity-electrode is according to any of Examples 8 to 10, the method further including detecting signal charged particles traversing through the aperture including outside of the circle.

According to Example 20, it is provided a method according to any of Examples 17 to 19, wherein the proximity-electrode is preferably according to Example 7 or according to any of Examples 1 to 10, the method further including setting the proximity-electrode including the protrusions, at a potential adapted for reducing a penetration of a column field through the proximity-electrode and reaching the sample.

While the foregoing is directed to embodiments, other and further embodiments may be devised without departing from the basic scope, and the scope thereof is determined by the claims that follow.

What is claimed is:

1. A proximity-electrode for a charged particle beam device, comprising:

a body having an aperture within the body; and the body having a plurality of protrusions cantilevering radially into the aperture, the aperture and the protrusions having an n-fold rotational symmetry, n being an integer;

wherein a minimum radius of curvature of each of the plurality of protrusions is more than 5% of a width or a diameter of the respective protrusion or wherein the protrusions have a minimum radius of curvature such that a maximum magnitude of a surface electric field on the protrusions is less than 3 times a maximum magnitude of a surface electric field on a body of the proximity-electrode.

2. The proximity-electrode of claim 1, wherein a minimum radius of curvature of each of the protrusions in a plane perpendicular to a plane of the proximity-electrode or in a plane perpendicular to a plane of the aperture of the proximity-electrode is larger than a minimum radius of curvature of the respective protrusion in a plane of the proximity-electrode or in a plane of the aperture of the proximity-electrode.

3. The proximity-electrode of claim 1, wherein a minimum radius of curvature at a free end or at a tip of each protrusion is equal to or larger than a half of a width at a middle or at a stem of the respective protrusion.

4. The proximity-electrode of claim 1, wherein an unsupported end of each protrusion has a bulbous shape adapted to decrease a surface electric field at the unsupported end.

5. The proximity-electrode of claim 1, wherein a length of each protrusion is at least 5% of a radius of the aperture and at most 80% of a radius of the aperture.

6. The proximity-electrode of claim 1, wherein a clear area of the aperture in a plane of the aperture is at least 10 mm$^2$.

7. The proximity-electrode of claim 1, further comprising a central circle within a plane of the aperture, the central circle being clear of the protrusions and extending up to an end or a tip of one or all of the protrusions.

8. The proximity-electrode of claim 7, wherein the proximity-electrode is aligned with at least one detector configured to detect signal charged particles emanating from the sample and traversing through the aperture including outside of the circle, or wherein the proximity- electrode is arranged such that signal charged particles emanating from the sample and traversing through the aperture including outside of the circle impinge on a backscattered charged particle detector.

9. The proximity-electrode of claim 1, wherein all areas of the aperture are contiguous with each other in a plane of the aperture.

10. A charged particle beam device for at least one of imaging and inspecting a sample, the charged particle beam device comprising:

a beam emitter for emitting a primary charged particle beam; and a retarding field device for retarding the primary charged particle beam before the primary charged particle beam impinges on the sample, the retarding field device comprising an objective lens and a proximity-electrode arranged downstream of a principal plane of the objective lens;

wherein the charged particle beam device is adapted for guiding the primary charged particle beam along an optical axis to the sample for generating signal charged particles from the sample;

wherein the proximity-electrode comprises a body having an aperture within the body; and the body having a plurality of protrusions cantilevering radially into the aperture, the aperture and the protrusions having an n-fold rotational symmetry, n being an integer.

11. The charged particle beam device of claim 10, wherein the proximity-electrode is arranged to be a last element of a charged particle beam device in a direction of a primary charged particle beam before the primary charged particle beam impinges on a sample.

12. The charged particle beam device of claim 10, wherein a diameter of the aperture of the proximity-electrode is at least 3 times a height of a space between the proximity-electrode and the sample.

13. The charged particle beam device of claim 10, wherein the proximity-electrode is adapted to be at a more negative potential than a column potential.

14. The charged particle beam device of claim 10, wherein the proximity-electrode is arranged proximate to the objective lens or within an effective field of the objective lens.

15. The charged particle beam device of claim 10, wherein a diameter of the circle is at least twice a height of a space separating the proximity-electrode and a sample.

16. A method for at least one of imaging and inspection of a sample using a charged particle beam device, wherein the charged particle beam device is adapted for guiding the primary charged particle beam along an optical axis to the sample for generating signal charged particles from the sample, the method comprising:

emitting a primary charged particle beam with a beam emitter; and retarding the primary charged particle beam before the primary charged particle beam impinges on the sample with a retarding field device, the retarding field device comprising an objective lens and a proximity-electrode arranged downstream of a principal plane of the objective lens;

wherein the proximity-electrode comprises a body having an aperture within the body; and the body having a plurality of protrusions cantilevering radially into the aperture, the aperture and the protrusions having an n-fold rotational symmetry, n being an integer.

17. The method of claim 16, wherein the proximity-electrode further comprises a central circle within a plane of the aperture, the central circle being clear of the protrusions and extending up to an end or a tip of one or all of the protrusions, the method further comprising guiding the primary charged particle beam through the aperture, through the central circle.

18. The method of claim 16, wherein the proximity-electrode further comprises a central circle within a plane of the aperture, the central circle being clear of the protrusions and extending up to an end or a tip of one or all of the protrusions, the method further comprising detecting signal charged particles traversing through the aperture including outside of the circle.

19. The method of claim 16, wherein a clear area of the aperture in a plane of the aperture is at least 10 mm$^2$, the method further comprising setting the proximity-electrode including the protrusions, at a potential adapted for reducing a penetration of a column field through the proximity-electrode and reaching the sample.

* * * * *